United States Patent [19]
Pulvirenti et al.

[11] Patent Number: 6,133,766
[45] Date of Patent: Oct. 17, 2000

[54] CONTROL CIRCUIT FOR THE CURRENT SWITCH EDGES OF A POWER TRANSISTOR

[75] Inventors: Francesco Pulvirenti, Acireale; Patrizia Milazzo, Messina, both of Italy

[73] Assignee: SGS-Thomson Microelectronics S.R.L., Agrate Brianza, Italy

[21] Appl. No.: 09/087,549

[22] Filed: May 29, 1998

[30] Foreign Application Priority Data

May 30, 1997 [EP] European Pat. Off. ............. 97830258

[51] Int. Cl.[7] .................................................. H02M 11/00
[52] U.S. Cl. ........................ 327/103; 327/134; 327/170; 327/434
[58] Field of Search ..................................... 327/103, 108, 327/132, 134, 170, 427, 434, 381; 307/46, 48

[56] References Cited

U.S. PATENT DOCUMENTS

| | | |
|---|---|---|
| 4,371,826 | 2/1983 | Shelly .......................................... 320/21 |
| 4,947,063 | 8/1990 | O'Shaughnessy et al. ............. 307/572 |
| 5,420,499 | 5/1995 | DeShazo ................................. 323/315 |
| 5,625,306 | 4/1997 | Tada ......................................... 327/403 |
| 5,736,879 | 4/1998 | Pham ....................................... 327/132 |
| 5,781,060 | 7/1998 | Sugawara ................................ 327/403 |
| 5,789,955 | 8/1998 | Scheraga ................................. 327/170 |
| 5,825,218 | 10/1998 | Colli et al. .............................. 327/403 |

*Primary Examiner*—Jung Ho Kim
*Attorney, Agent, or Firm*—Jenkens & Gilchrist; Theodore E. Galanthay

[57] ABSTRACT

A battery-charging electronic device comprises a current generator adapted to supply a charging current to a battery and a controlled current edge switch having a circuit for controlling the switching edges of current being flowed through a power transistor. The switching edge control circuit comprises a controlled edge variable voltage generator for generating a controlled edge voltage signal, a voltage/current converter for converting the voltage signal to a controlled edge current signal, and a driver circuit for the power transistor being input the controlled edge current signal to mirror, onto the power transistor, an output current which is proportional to the controlled edge current signal.

15 Claims, 3 Drawing Sheets

CONTROL CIRCUIT FOR THE CURRENT SWITCH EDGES OF A POWER TRANSISTOR

FIELD OF THE INVENTION

This invention relates to a circuit for controlling the switching edges of current delivered from a power transistor.

BACKGROUND OF THE INVENTION

Controlled on/off switches for controlling the switching edges of current delivered from a power transistor are currently formed of discrete components including a bipolar transistor, which is driven by a constant voltage edge when turned on and off. This rather crude technique has a disadvantage in that the propagation times are long and the switching edges of the output current are dependent on the transistor beta.

An embodiment of a prior art switch adapted to connect the battery to the battery charger in a "soft" manner, is shown in FIG. 1. The operation of the circuit device of FIG. 1, and its applications, will now be described in better detail. The battery can be modeled by a voltage generator whose value varies typically from a few hundred milliVolts, in the exhausted condition, to 5–10V when fully charged, and a series resistor of very low value (100 to 200 milliOhms). The battery charger. can be represented schematically by a current generator 2 which is saturated at a predetermined voltage. In this particular instance, the values of current and voltage would be 1.2 A and 16V, respectively.

The device depicted in FIG. 1 complete of its served circuits, operates in either of two modes: a start-up mode and a PWM mode. It enters the start-up mode when the battery is exhausted, and is held there for a few tenths of a second, enough time to have the battery charged to an intermediate level (about 3 Volts). The transistor P1 is off, and the voltage regulator 4 is activated to limit the current at 180 mA. During this initial phase where the battery is in the exhausted condition, it is important that the battery be charged with a smaller current than that supplied by the battery charger, to avoid damaging the battery.

Upon a battery voltage being reached at which all the circuitry to be powered by the battery can begin to operate (for example, 3 Volts in this case), the start-up regulator 4 is turned off and the device allowed to operate in the PWM mode. During the latter phase, the cellular telephone is able to operate properly, and the battery charging is handled by a microprocessor, outside the device 1 in question, which controls the transistor P1 through its PWM pin. Hence the need to control the battery charging current edges so as to prevent steep switchings from disturbing the communications.

Thus, it can be appreciated from FIG. 1 that this conventional approach has the following disadvantages:

the propagation time of the turn-on command is quite long and dependent on the voltage at the VCH pin, to which the charging current from the generator 2 is applied, and on the base-emitter junction voltage of the transistor P1, i.e., $$T_{ON} = R1 * C1 * \ln(V_C H / V_C H - V_B E); \quad (1)$$

the current edge is a coarse value, and dependent on the voltage at the pin VCH and the beta of the transistor P1.

The underlying technical problem of this invention is to provide a circuit for controlling the switching edges of a power transistor, which can operate at low propagation times and control the output current with high accuracy, thereby overcoming the aforementioned limitations of the prior art.

SUMMARY OF THE INVENTION

Accordingly, the present invention provides a circuit for controlling the switching edges of current delivered from a power transistor having at least one control terminal and two main conduction terminals. The circuit comprises a controlled edge, variable voltage generator for generating a controlled edge voltage signal, a voltage/current converter for converting the voltage signal to a controlled edge current signal, and a driver circuit for the power transistor being input the controlled edge current signal to mirror, onto the main conduction path of the power transistor, an output current which is proportional to the controlled edge current signal.

The present invention also provides an electronic device for battery charging. The device comprises a current generator adapted to supply a charging current to the battery, controlled current edge switch having at least one power transistor with at least one control terminal and two main conduction terminals, and having a circuit for controlling the switching edges of the current flowing through the power transistor. The circuit for controlling the switching edges comprises a controlled edge variable voltage generator for generating a controlled edge voltage signal, a voltage/current converter for converting the voltage signal to a controlled edge current signal, and a driver circuit for the power transistor being input the controlled edge current signal to mirror, onto the main conduction path of the power transistor, an output current which is proportional to the controlled edge current signal.

The present invention can be fully integrated, utilize a MOS transistor, and provide short propagation times and highly accurate control of both the output current and the switching edges.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The features and advantages of a circuit and device according to the present invention will be more clearly apparent from the following detailed description of practical embodiments thereof, as illustrated by way of non limitative examples in the accompanying drawings.

DETAILED DESCRIPTION OF A PREFERRED EMBODIMENT OF THE INVENTION

Generally, this invention relates to a controlled on/off switch which is connected between a battery charger and a battery, and incorporated to a portable apparatus equipped with rechargeable batteries, such as a cellular telephone set.

This switch is intended for protecting the battery against possible voltage peaks resulting from connection/disconnection of the battery to/from the battery charger. In addition, with the current edges controlled as the load current is being turned on and off, electromagnetic radiations from excessively steep switching edges are suppressed which could interfere with communications in the instance of a cellular telephone, and in general with the apparatus performance.

The present invention uses a voltage signal having controlled rising and falling edges, converts it to a current signal, and mirrors it at the device output onto a power transistor, to thereby obtain an accurate control of the transistor current edges.

Figure 1:
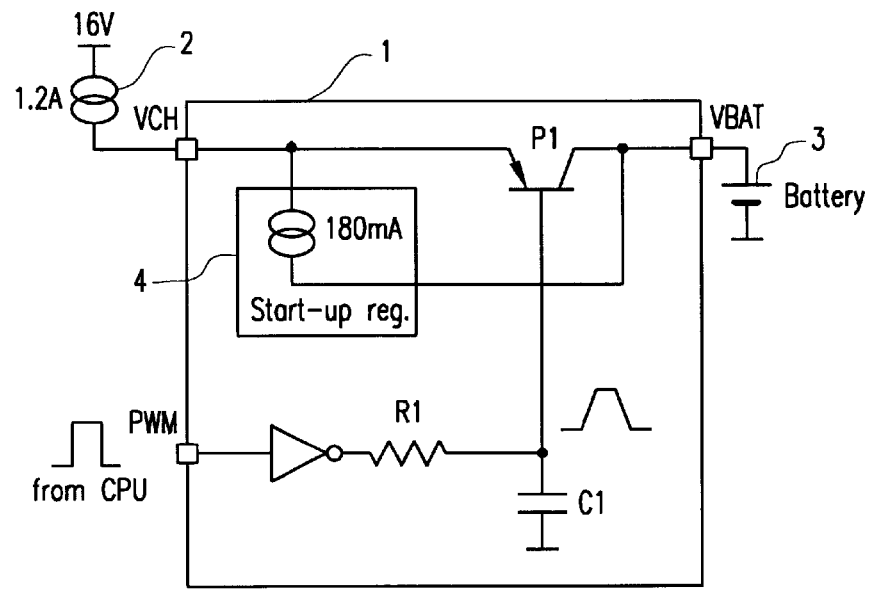
FIG. 1 shows a prior art conventional circuit for controlling the switching edges of a power transistor.
Figure 2:
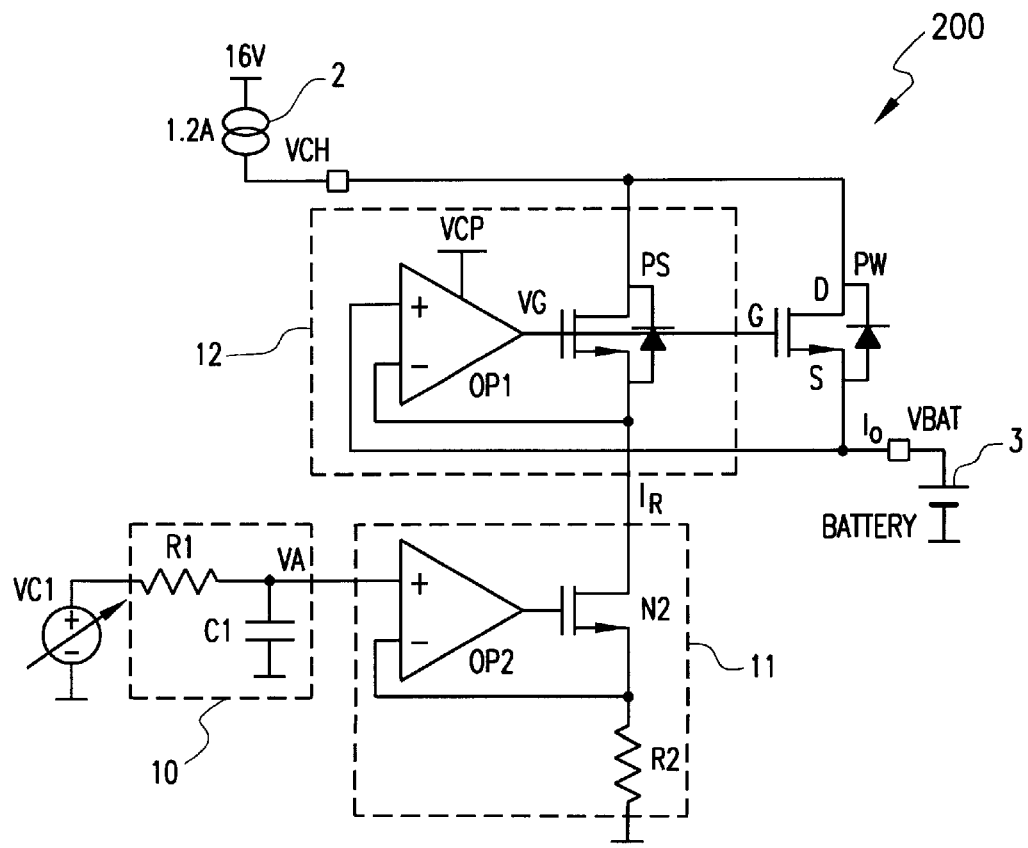
FIG. 2 shows a circuit for controlling the switching edges of a power transistor, according to the present invention.

FIG. 2 shows a circuit for controlling the switching edges of a power transistor, which embodies this invention.

The circuit 200 is connected between a battery charger, schematically illustrated by a current generator 2 connected to the terminal VCH of the circuit, and a battery 3 connected to the terminal VBAT.

The circuit 200 comprises the following circuit parts:

- a power transistor PW of the MOS type having a drain-source main conduction path connected between the terminals VCH and VBAT of the circuit;
- a driver circuit 12 for the power transistor PW, which consists of an operational amplifier OP1, being supplied a higher positive voltage VCP than the voltage VCH, and a transistor PS coupled to the power transistor PW;
- a voltage/current converting block 11, which consists of an operational amplifier OP2, a transistor N2, and a resistor R2, and functions to convert a voltage waveform VA at its positive input to a current waveform $I_R$ which is proportional to the resistance of the resistor R2; and
- a generator of a controlled edge variable voltage VA, which comprises a controlled variable voltage generator VC1 and a low-pass filter block 10 operative to filter out the voltage variations of the voltage generator VC1.

The transistor PS has a gate terminal connected to the gate terminal of the power transistor PW and to an output terminal of the operational amplifier OP1, and has a drain terminal connected to the drain of the power transistor PW.

The operational amplifier OP1 has an inverting input connected to the source terminal of the transistor PS, and a non-inverting input connected to the source terminal of the power transistor PW at the circuit node VBAT. In combination with the transistor PS, this operational amplifier is to mirror the current $I_R$ from the voltage/current converting block 11 to the output current $I_O$ being flowed through the power transistor PW.

The manner of generating the current $I_R$ will now be explained.

Figure 3:
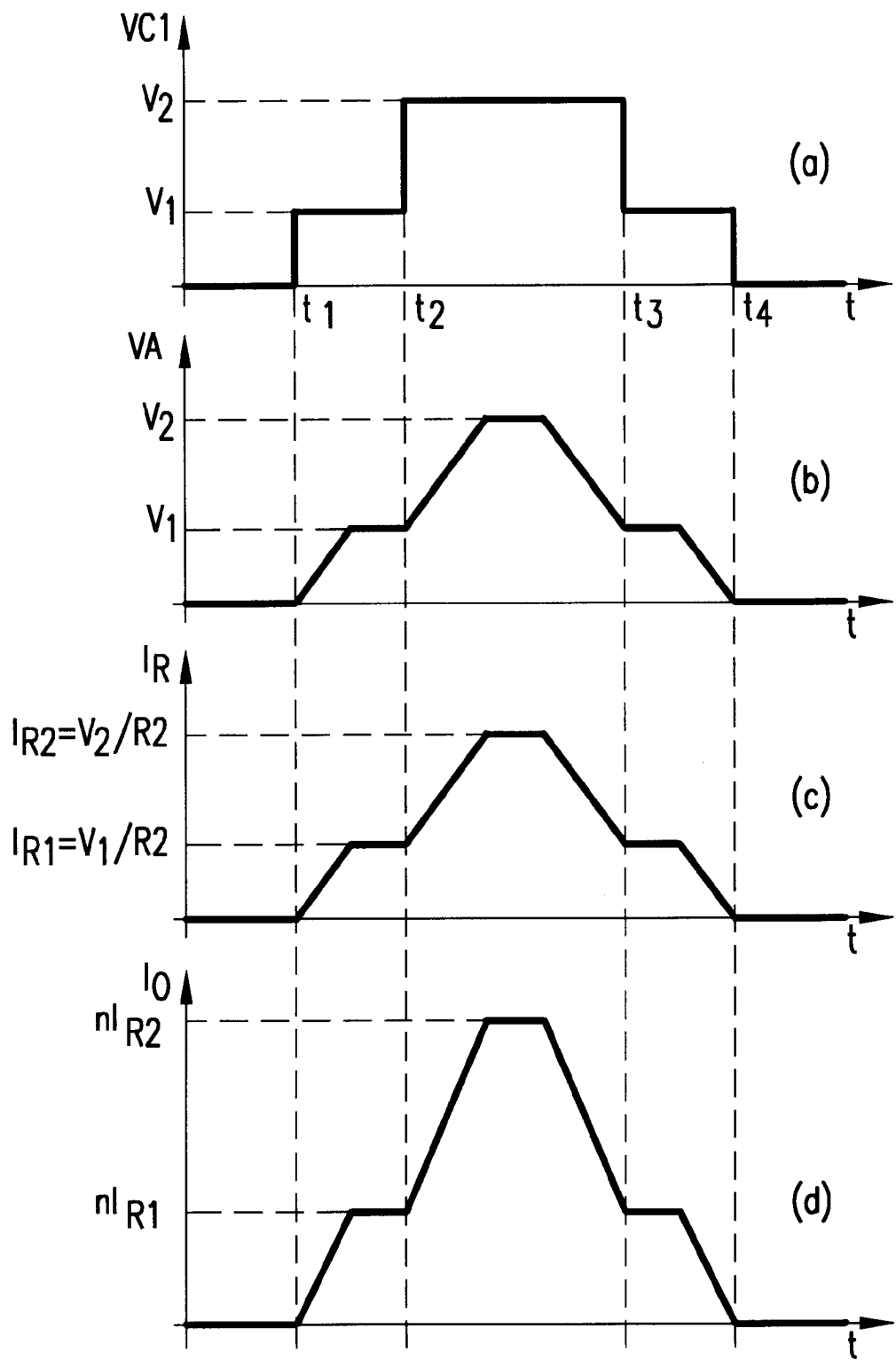
FIG. 3 is a plot vs. time of certain voltage signals and current signals in the circuit of FIG. 2.

The variable voltage generator VC1 can generate at least two different voltage levels, V1 and V2, as shown by curve (a) in FIG. 3. The setting of this generator, e.g. at V1, is filtered through the low-pass filter block 10 to produce a controlled edge voltage signal VA, shown by curve (b) in FIG. 3.

Specifically, to obtain a fully linear signal edge, the resistor R1 in the filter block may be replaced with a constant current generator I1.

The voltage VA applied to a non-inverting input of the operational amplifier OP2 is converted, through the voltage/current converting block, to a current $I_R$ having the same time pattern as the signal VA illustrated by curve (c) in FIG. 3 and an inversely proportional value to the resistance of R2; i.e.:

$$I_R = V_A/R2.$$

The current $I_R$ is multiplied by the surface area ratio of the transistors PS and PW, thereby generating the output current $I_o$ for supply to the battery 3. The operational amplifier OP1 functions to drive the gating node VG of the transistors PS and PW so as to maintain the current ratio $I_o/I_R$, set by the surface area ratio n of PS to PW.

Using this circuit, the edges of the battery charging current will be controlled, so that the slew rate can be adjusted to suit the application requirements. In fact, the slew rate of the current $I_o$ will be:

$$DI_o/\Delta t = n*I_1/C1*R2 \qquad (2)$$

where n is the surface area ratio of PS to PW.

The present invention proposed herein may be implemented with BCD technology in a device having the function of connecting the battery to the battery charger in a "soft" manner.

In this instance, the battery charging current $I_O$ could take either of two values: in the start-up mode, the current was 180 mA, and in the PWM mode, the current was equal to the maximum current (1.2 A) supplied by the battery charger, and was limited internally to 1.8 A. In either cases, the slew rate of the output current is 300 mA/ms.

This slew rate is obtained based on the following circuit parameters:

- surface area ratio of the transistors, PW and PS,=1000;
- current generator $I_1$=10 microAmpere;
- a resistor R2=1 kOhm;
- an external capacitor C1=33 nF.

To obtain the output current values of 180 mA (start-up mode) and 1.8 A (PWM mode) from the voltage generator VC1, the settings were V1=180 mV and V2=1.8V, respectively.

The internal limiting current has been set at a higher value than the maximum current that the battery charger can supply such that, with the device operated in the PWM mode, the transistor PW is operating within its linear range, with an equivalent resistance of 300 milliOhms.

In fact, upon the current $I_o$ reaching the maximum current supplied from the battery charger, the voltage at the inverting input of the operational amplifier OP1 will tend to decrease, allowing the voltage VG at the gating node of the transistors PS and PW to rise up to VCP. In this way the transistor PW overdrive will be maximum (about 10 Volts) and allow it to operate in its resistive range.

Figure 4:
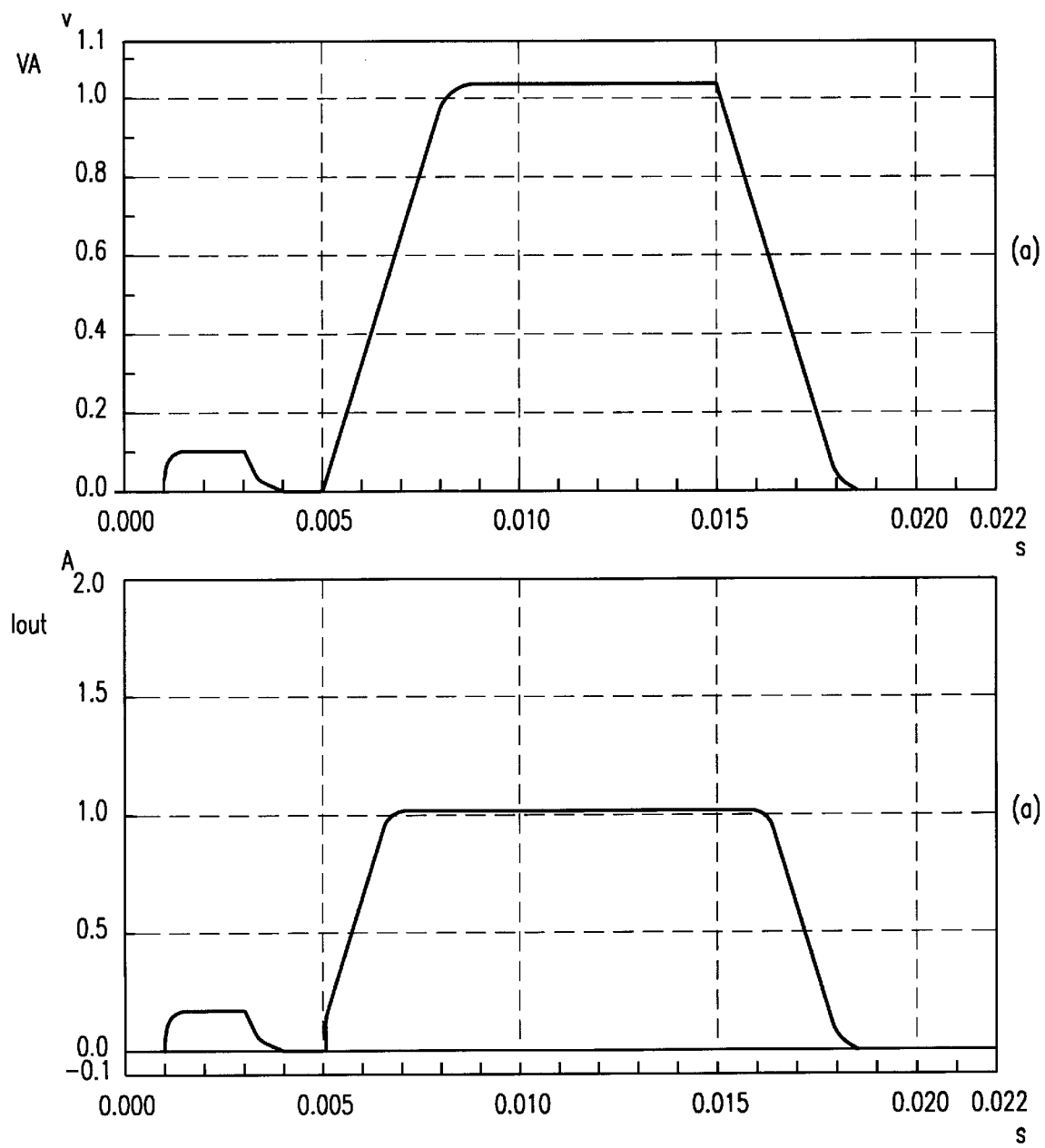
FIG. 4 is a plot vs. time of certain voltage signals and current signals as obtained by electrical simulation of the circuit shown in FIG. 2.

FIG. 4 illustrates the behaviors of the voltage VA at the capacitor C1 and of the battery charging current $I_o$, as obtained by electrical simulation of the circuit proposed. In this case, the slew rate of the current $I_o$ was set at 600 mA/ms.

The advantages of the present invention are, therefore, the following:

the slew rate of the output current $I_o$ is controlled in conformity with relationship (2); it can be seen that it depends on parameters which can be highly accurate and changed in a simple manner to make the circuit fit different applications;

the absolute value of the battery charging current $I_o$ can be set by suitably varying the variable voltage generator VC1, the resistance value of R2, and the surface area ratio n of the transistors PS and PW; and the turn-on signal propagation time is only dependent on the threshold voltages of the transistors PS and PW.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A circuit for controlling the switching edges of current delivered from a power transistor having at least one control terminal and two main conduction terminals, comprising:

a controlled edge, variable step DC voltage generator for generating a controlled edge voltage signal;

a voltage/current converter for converting said voltage signal to a controlled edge current signal; and a driver circuit for the power transistor having as an input said controlled edge current signal to mirror, onto the main conduction path of the power transistor, an output current proportional to said controlled edge current signal;

wherein the controlled edge variable step DC voltage generator comprises a controlled variable step DC voltage generator and a low-pass filter adapted to filter voltage variations of the variable step DC voltage generator.

2. The circuit according to either claim 1, wherein the voltage/current converter comprises:

an operational amplifier having a non-inverting input terminal coupled to the variable voltage generator, an inverting input terminal, and an output terminal; and a first transistor having a control terminal connected to the output terminal of the operational amplifier, and having a conduction path in series with a resistor between an output terminal of the converter and a voltage reference, with a node, intermediate the first transistor and the resistor, being connected to the inverting input of the operational amplifier.

3. The circuit according to claim 1, wherein the driver circuit of the power transistor comprises:

a second transistor having a control terminal coupled to the control termina of the power transistor, a first conduction terminal coupled to a first conduction terminal of the power transistor, and a second conduction terminal connected to an output terminal of the voltage/current converter; and an operational amplifier having a non-inverting input terminal coupled to a second conduction terminal of the power transistor, an inverting input terminal coupled to the second conduction terminal of the second transistor, and an output terminal coupled to the common node between the control terminals of the power and second transistors.

4. A circuit for controlling the switching edges of current delivered from a power transistor having at least one control terminal and two main conduction terminals, comprising:

a controlled edge, variable step DC voltage generator for generating a controlled edge voltage signal;

a voltage/current converter for converting said voltage signal to a controlled edge current signal; and a driver circuit for the power transistor having as an input said controlled edge current signal to mirror, onto the main conduction path of the power transistor, an output current proportional to said controlled edge current signal;

wherein the voltage/current converter comprises:

an operational amplifier having a non-inverting input terminal coupled to the variable voltage generator, an inverting input terminal, and an output terminal; and a first transistor having a control terminal connected to the output terminal of the operational amplifier, and having a conduction path in series with a resistor between an output terminal of the converter and a voltage reference, with a node, intermediate the first transistor and the resistor, being connected to the inverting input of the operational amplifier.

5. The circuit according to claim 4, wherein the driver circuit of the power transistor comprises:

a second transistor having a control terminal coupled to the control terminal of the power transistor, a first conduction terminal coupled to a first conduction terminal of the power transistor, and a second conduction terminal connected to an output terminal of the voltage/current converter; and an operational amplifier having a non-inverting input terminal coupled to a second conduction terminal of the power transistor, an inverting input terminal coupled to the second conduction terminal of the second transistor, and an out put terminal coupled to the common node between the control terminals of the power and second transistors.

6. A circuit for controlling the switching edges of current delivered from a power transistor having at least one control terminal and two main conduction terminals, comprising:

a controlled edge, variable step DC voltage generator for generating a controlled edge voltage signal;

a voltage/current converter for converting said voltage signal to a controlled edge current signal; and a driver circuit for the power transistor having as an input said controlled edge current signal to mirror, onto the main conduction path of the power transistor, an output current proportional to said controlled edge current signal, the driver circuit comprising:

a second transistor having a control terminal coupled to the control terminal of the power transistor, a first conduction terminal coupled to a first conduction terminal of the power transistor, and a second conduction terminal connected to an output terminal of the voltage/current converter; and an operational amplifier having a non-inverting input terminal coupled to a second conduction terminal of the power transistor, an inverting input terminal coupled to the second conduction terminal of the second transistor, and an output terminal coupled to the common node between the control terminals of the power and second transistors.

7. The circuit according to claim 1, wherein the power transistor is an N-channel transistor of the MOS type.

8. An electronic device for battery charging, comprising:

a current generator adapted to supply a charging current to a battery;

a controlled current edge switch, electrically connected to said current generator, having at least one power transistor with at least one control terminal and two main conduction terminals, and having a circuit for controlling switching edges of a current flowing through the power transistor, said circuit for controlling being connected to said at least one control terminal; and wherein said circuit for controlling the switching edges comprises:

a controlled edge variable step DC voltage generator for generating a controlled edge voltage signal;

a voltage/current converter, electronically connected to said controlled edge variable step DC voltage generator, for converting said voltage signal to a controlled edge current signal; and a driver circuit, for the power transistor having as an input said controlled edge current signal from said voltage/current converter to mirror, and providing a control signal to said at least one control terminal of the power transistor, said current flowing through said power transistor being proportional to said controlled edge current signal;

wherein the controlled edge variable step DC voltage generator comprises a controlled variable step DC voltage generator, and a low-pass filter adapted to filter voltage variations of the variable voltage generator.

9. The device according to claim 8, wherein the voltage/current converter comprises:

an operational amplifier having a non-inverting input terminal coupled to the variable voltage generator, an inverting input terminal, and an output terminal; and a first transistor having a control terminal connected to the output terminal of the operational amplifier, and having a conduction path in series with a resistor between an output terminal of the converter and a voltage reference, with a node, intermediate the first transistor and the resistor, being connected to the inverting input of the operational amplifier.

10. The device according to claim 8, wherein the driver circuit for the power transistor comprises:

a second transistor having a control terminal coupled to the control terminal of the power transistor, a first conduction terminal coupled to a first conduction terminal of the power transistor (PW), and a second conduction terminal connected to an output terminal of the voltage/current converter; and an operational amplifier having a non-inverting input terminal coupled to a second conduction terminal of the power transistor, an inverting input terminal coupled to the second conduction terminal of the second transistor, and an output terminal coupled to the common node between the control terminals of the power and second transistors.

11. A circuit for controlling the switching edges of current delivered from a power transistor having at least one control terminal and two main conduction terminals, comprising:

a controlled edge, variable step DC voltage generator for generating a controlled edge voltage signal;

a voltage/current converter for converting said voltage signal to a controlled edge current signal; and a driver circuit for the power transistor, having as an input said controlled edge current signal from said voltage/current converter to mirror, and providing a control signal to said at least one control terminal of the power transistor, said current flowing through said power transistor being proportional to said controlled edge current signal;

wherein the voltage/current converter comprises:

an operational amplifier having a non-inverting input terminal coupled to the variable voltage generator, an inverting input terminal, and an output terminal; and a first transistor having a control terminal connected to the output terminal of the operational amplifier, and having a conduction path in series with a resistor between an output terminal of the converter and a voltage reference, with a node, intermediate the first transistor and the resistor, being connected to the inverting input of the operational amplifier.

12. The device according to claim 11, wherein the driver circuit for the power transistor comprises:

a second transistor having a control terminal coupled to the control terminal of the power transistor, a first conduction terminal coupled to a first conduction terminal of the power transistor (PW), and a second conduction terminal connected to an output terminal of the voltage/current converter; and an operational amplifier having a non-inverting input terminal coupled to a second conduction terminal of the power transistor, an inverting input terminal coupled to the second conduction terminal of the second transistor, and an output terminal coupled to the common node between the control terminals of the power and second transistors.

13. A circuit for controlling the switching edges of current delivered from a power transistor having at least one control terminal and two main conduction terminals, comprising:

a controlled edge, variable step DC voltage generator for generating a controlled edge voltage signal;

a voltage/current converter for converting said voltage signal to a controlled edge current signal; and a driver circuit for the power transistor having as an input said controlled edge current signal from said voltage/current converter to mirror, and providing a control signal to said at least one control terminal of the power transistor, said power transistor having a current which is proportional to said controlled edge current signal, wherein the driver circuit for the power transistor comprises:

a second transistor having a control terminal coupled to the control terminal of the power transistor, a first conduction terminal coupled to a first conduction terminal of the power transistor (PW), and a second conduction terminal connected to an output terminal of the voltage/current converter; and an operational amplifier having a non-inverting input terminal coupled to a second conduction terminal of the power transistor, an inverting input terminal coupled to the second conduction terminal of the second transistor, and an output terminal coupled to the common node between the control terminals of the power and second transistors.

14. The device according to claim 8, wherein the power transistor is an N-channel transistor of the MOS type.

15. A circuit for controlling the switching edges of current delivered from a power transistor having at least one control terminal and two main conduction terminals, comprising:

a controlled edge, variable step DC voltage generator for generating a controlled edge voltage signal;

a voltage/current converter for converting said voltage signal to a controlled edge current signal, said voltage/current converter comprising:

an operational amplifier having a non-inverting input terminal coupled to the variable voltage generator, an inverting input terminal, and an output terminal; and a first transistor having a control terminal connected to the output terminal of the operational amplifier, and having a conduction path in series with a resistor between an output terminal of the converter and a voltage reference, with a node, intermediate the first transistor and the resistor, being connected to the inverting input of the operational amplifier; and a driver circuit for the power transistor being input said controlled edge current signal to mirror, onto the main conduction path of the power transistor, an output current which is proportional to said controlled edge current signal.

* * * * *